(12) United States Patent
Michalicek

(10) Patent No.: US 7,067,892 B1
(45) Date of Patent: Jun. 27, 2006

(54) OFF SUBSTRATE FLIP-CHIP APPARATUS

(75) Inventor: Mark A. Michalicek, Usafa, CO (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 197 days.

(21) Appl. No.: 10/690,158

(22) Filed: Oct. 16, 2003

Related U.S. Application Data

(60) Provisional application No. 60/419,336, filed on Oct. 17, 2002.

(51) Int. Cl.
*H01L 29/84* (2006.01)

(52) U.S. Cl. .................. 257/415; 257/414; 359/291

(58) Field of Classification Search ............ 257/414, 257/415; 359/291
See application file for complete search history.

(56) References Cited

U.S. PATENT DOCUMENTS

| | | | |
|---|---|---|---|
| 5,994,159 A | 11/1999 | Aksyuk et al. | |
| 6,300,156 B1 | 10/2001 | Decker et al. | |
| 6,396,975 B1 | 5/2002 | Wood et al. | |
| 6,396,976 B1 | 5/2002 | Little et al. | |
| 6,404,942 B1 | 6/2002 | Edwards et al. | |
| 6,470,110 B1 | 10/2002 | Lin | |
| 6,600,850 B1 | 7/2003 | Fan | |
| 6,755,982 B1* | 6/2004 | Lin | 216/2 |
| 6,870,660 B1* | 3/2005 | DiCarlo | 359/291 |
| 2001/0040675 A1 | 11/2001 | True et al. | |
| 2002/0021860 A1 | 2/2002 | Ruan et al. | |
| 2002/0168144 A1 | 11/2002 | Chen et al | |
| 2002/0185699 A1* | 12/2002 | Reid | 257/414 |

OTHER PUBLICATIONS

Pister et al., "Microfabricated Hinges", Sensors and Actuators, 1992, pp. 249-256, vol. A33, Elsevier Sequoia.

* cited by examiner

Primary Examiner—Bradley K. Smith
Assistant Examiner—Douglas Menz
(74) Attorney, Agent, or Firm—AFMCLO/JAZ; Gerald B. Hollins

(57) ABSTRACT

A flip-chip micromechanical device in which one module of a flip-chip device is stabilized in the substrate-free condition to a degree permitting its successful combination with a second module of the flip-chip device without the benefit of a supporting but interfering substrate element. An etch plate header and coupling tethers provide supporting rigidity to the substrate removed module during its manipulation sequence. Locking of the substrate-free module into a manipulation tolerant and manageable, even by hand, cantilevered status is included. Simplified off chip fabrication of MEMS devices in low cost facilities having only basic alignment equipment is supported by the invention.

4 Claims, 10 Drawing Sheets

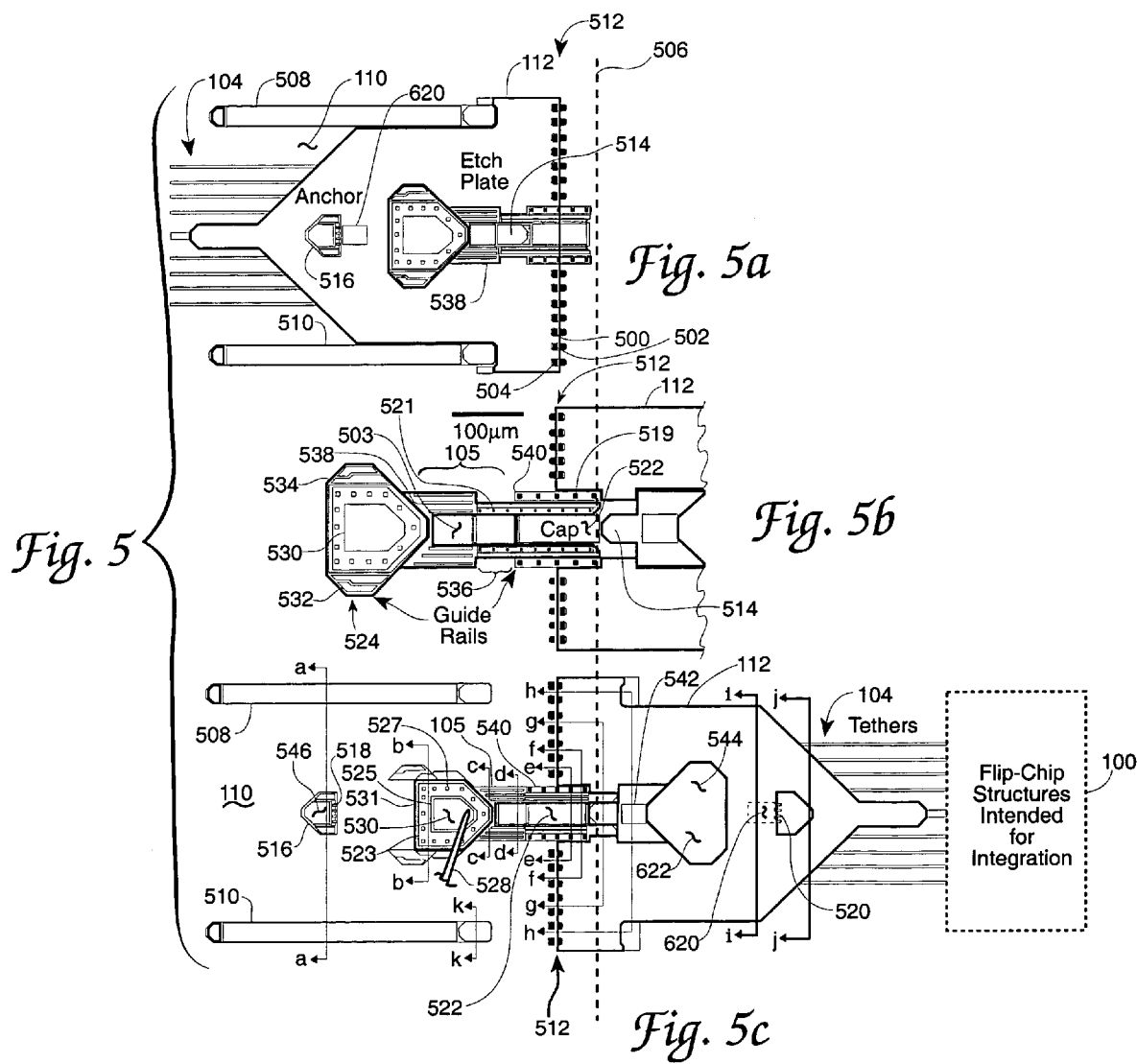

Sliding Latch

100μm

50μm

1100

OFF SUBSTRATE FLIP-CHIP APPARATUS

The present application claims priority of Provisional Patent Application No. 60/419,336, filed Oct. 17, 2002 entitled "Latching Off-Chip Hinge Mechanism for Micromechanical Systems (MEMS) Components". The contents of this Provisional Patent Application are hereby incorporated by reference herein.

CROSS REFERENCE TO RELATED PATENT DOCUMENTS

The present document is somewhat related to the co pending and commonly assigned patent application documents "MICROMECHANICAL DEVICE LATCHING, Ser. No. 10/690,157 and "HINGED BONDING OF MICROMECHANICAL DEVICES" Ser. No. 10/690,159 that are filed of even date herewith. The contents of these somewhat related applications are hereby incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Commercial semiconductor foundries often limit designers to a few choices of materials or number of structural layers in a fabricated device. As a result it may not be possible to create many specialized devices required for demanding semiconductor or Micro Electro Mechanical Systems (MEMS) applications without custom fabrication methods, methods that are usually expensive to employ. As an alternative, highly complex structures can be made by flip-chip bonding of surface-micromachined features onto a variety of other substrates or even other chips fabricated in the same process. The original often silicon host substrate is then discarded during a following release etch to provide advanced MEMS devices that are suitable for RF, microwave, or optical applications where specific material properties or additional structural layers are required.

In recent years, the use of flip-chip assembly to create advanced MEMS devices has been shown to be a fast, reliable, simple and inexpensive method to produce highly planarized devices consisting of as many as five structural layers on virtually any desired substrate. This process has been demonstrated with a variety of micromirror arrays and variable capacitors fabricated atop ceramic substrates to achieve improved RF characteristics. Even more advanced micromirror arrays have been fabricated atop receiving modules prefabricated in a same processing run as the host module. Numerous styles of cantilever, torsion, and piston micromirror arrays have been demonstrated and these boast a variety of desirable characteristics. Mirror devices can for example achieve CMOS compatible low voltage addressing potentials or more than 3 micrometers of stable mechanical deflection since the mirror surfaces can rest as much as 10 micrometers above the substrate. Typical arrays have been designed with as much as 98.8% active surface area. Torsion and cantilever devices have demonstrated as much as 20 degrees of tilt using a variety of flexure arrangements to reduce needed electrical addressing potentials. The mirror surface of each such device is initially fabricated as the underside of a first releasable structural layer such that no topographical effects are induced. As a result, flip-chip micromirrors consistently demonstrate less than 2 nanometers of root-mean square surface roughness.

Flip chip bonding of two integrated circuit sized component modules into a MEMS or other single device has however almost universally required each of the component modules to remain on its fabrication substrate or a substitute substrate during the bonding operation. The known few exceptions to this rule involve especially fabricated modules affording some special form of protection for one module. The present invention changes this situation into one wherein someone with access to the most basic device fabrication capability and its tools can achieve flip chip bonded devices, including devices fabricated on two different and incompatible substrate materials and devices fabricated to include multiple MEMS modules in stacked array. Moreover the present invention eliminates a significant difficulty in correctly aligning two substrate-mounted modules for bonding. Since the present invention allows use of simple visual alignment procedures it eliminates the need for an expensive piece of measurement-capable fabrication equipment and need for the skilled user to operate this equipment. In direct terms, the present invention is thus concerned with improved off-substrate bonding.

The prior publication and patent art includes numerous examples of hinge and pivot arrangements used for erecting structural elements in an assembled MEMS device or as an active part of the MEMS device function. The concept of using a hinge or pivot as a key part of the assembly or fabrication procedure for a MEMS device, and especially for off chip rotation of substrate-free MEMS modules, appears however to be significantly less well known in the art. Several examples of prior art documents illustrating this state of the MEMS art are included in the references identified with the filing of the present document.

The present invention provides for off chip or off substrate positioning of a substrate-removed MEMS circuit die for the purpose of subsequent die processing including bonding with another die to form an integral MEMS device.

It is therefore an object of the present invention to provide an off-chip apparatus and procedure by which simplified flip-chip bonding can be accomplished.

It is another object of the present invention to provide a pre-release, before bonding MEMS method and apparatus.

It is another object of the invention to provide a procedure and apparatus enabling the transfer of virtually any flip-chip module to any desired substrate without difficulty.

It is another object of the present invention to provide a damage protected off substrate flip-chip assembly arrangement.

It is another object of the invention to provide a procedure and apparatus supporting the rapid prototyping of flip-chip devices without specialized equipment.

It is another object of the present invention to provide a procedure and apparatus enabling reduced alignment error during assembly of a flip-chip device.

It is another object of the present invention to provide a procedure and apparatus enabling use of probe station apparatus for flip-chip manipulation and alignment purposes.

It is another object of the present invention to provide a procedure and apparatus in which a MEMS receiving module is visible in the same image as the host structure during bonding alignment.

It is another object of the invention to provide a procedure and process producing enhanced yields in a MEMS fabrication operation.

It is another object of the invention to provide a procedure and process by which flip-chip device assembly can be accomplished with little assembly preprocessing and a minimum of bonding equipment.

It is another object of the present invention to provide for the non-wired combination of incompatible process modules to form a MEMS device.

It is another object of the present invention to provide for the combination of two or more low cost, perhaps incompatible, module fabrication processes to achieve a complex MEMS module for a flip-chip MEMS device.

It is another object of the present invention to provide for the direct combination of a MEMS module with a CMOS module to form a CMOS MEMS device that is free of module interconnecting wiring.

It is another object of the present invention to provide a CMOS MEMS Integrated Microsystem device in which an oxide surface layer of a CMOS module provides desirable inherent electrical isolation between CMOS electrical circuitry and MEMS electrical circuitry.

It is another object of the present invention to provide a MEMS device fabrication arrangement in which multiple layers of MEMS modules may be stacked to form a complex MEMS device.

It is another object of the present invention to provide a MEMS device having two, three, four or more MEMS module layers.

It is another object of the present invention to provide an N layered flip-chip MEMS device.

It is another object of the present invention to provide a substrate free flip-chip apparatus that is subject to late stage election between its use or non use during a fabrication procedure.

It is another object of the present invention to provide a flip-chip assembly procedure enabling late stage process election between a variety of module segregation techniques.

It is another object of the present invention to provide a MEMS latch arrangement in which a MEMS module transfer mechanism can be fabricated using only uppermost and existing MEMS module layers in its composition.

These and other objects of the invention will become apparent as the description of the representative embodiments proceeds.

These and other objects of the invention are achieved by the rotationally mergeable MEMS apparatus comprising the combination of:

an electronic circuit module having a MEMS active element controlling output electrode disposed in an upper layer output location thereof;

a mating MEMS active element module having an electromagnetic field movable active element disposed in an exposed, said output electrode corresponding, location thereof, said MEMS active element module including module supporting flexible tensile members connected with a substrate hinge-mounted sacrificial MEMS active element module support element; and a MEMS active element module physical support element latching member movably mounted on said substrate and disposable in a position of mutually locked engagement with said substrate hinge mounted MEMS active element module support element in a selected off-chip and rotated about said hinge location thereof adjacent said electronic circuit module.

BRIEF DESCRIPTION OF THE DRAWINGS

The accompanying drawings incorporated in and forming a part of the specification, illustrate several aspects of the present invention and together with the description serve to explain the principles of the invention. In the drawings:

FIG. 5a shows a more detailed view of one portion of a FIG. 1 type of MEMS module.

FIG. 5b shows the FIG. 5a apparatus in a rotated element condition.

FIG. 5c shows the FIG. 5a apparatus in a rotated and latched element condition.

DETAILED DESCRIPTION OF THE INVENTION

Figure 1:
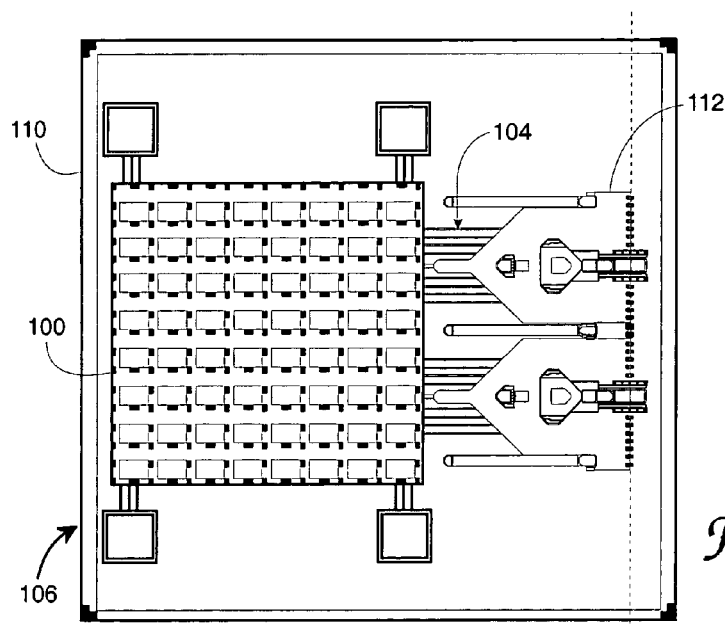
FIG. 1 shows the layout of a micromirror module array on a sacrificial fabrication substrate.
Figure 2:
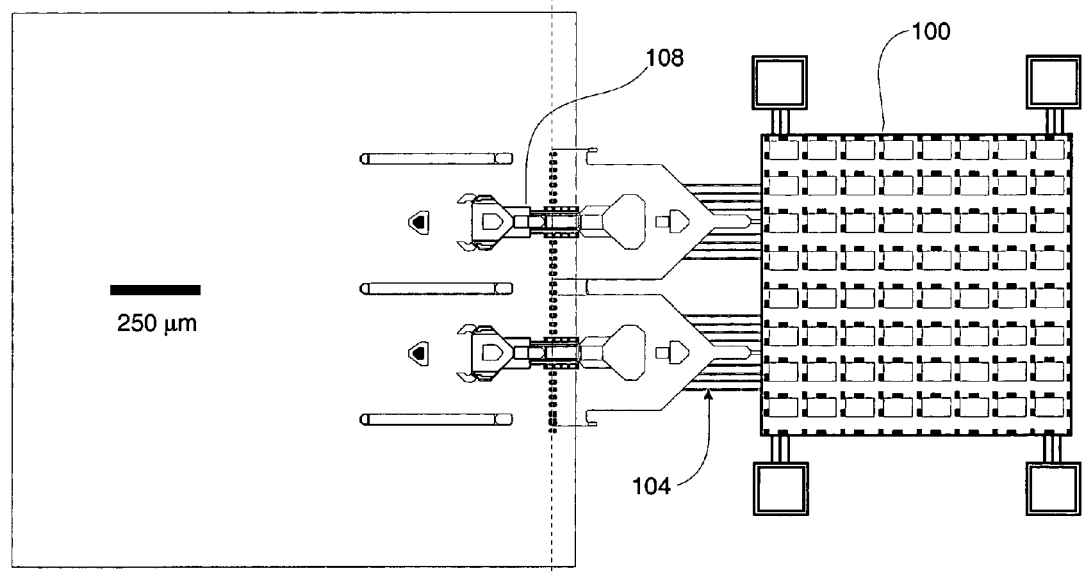
FIG. 2 shows the FIG. 1 module array in a hinge-rotated, latched, off-chip state.
Figure 3:
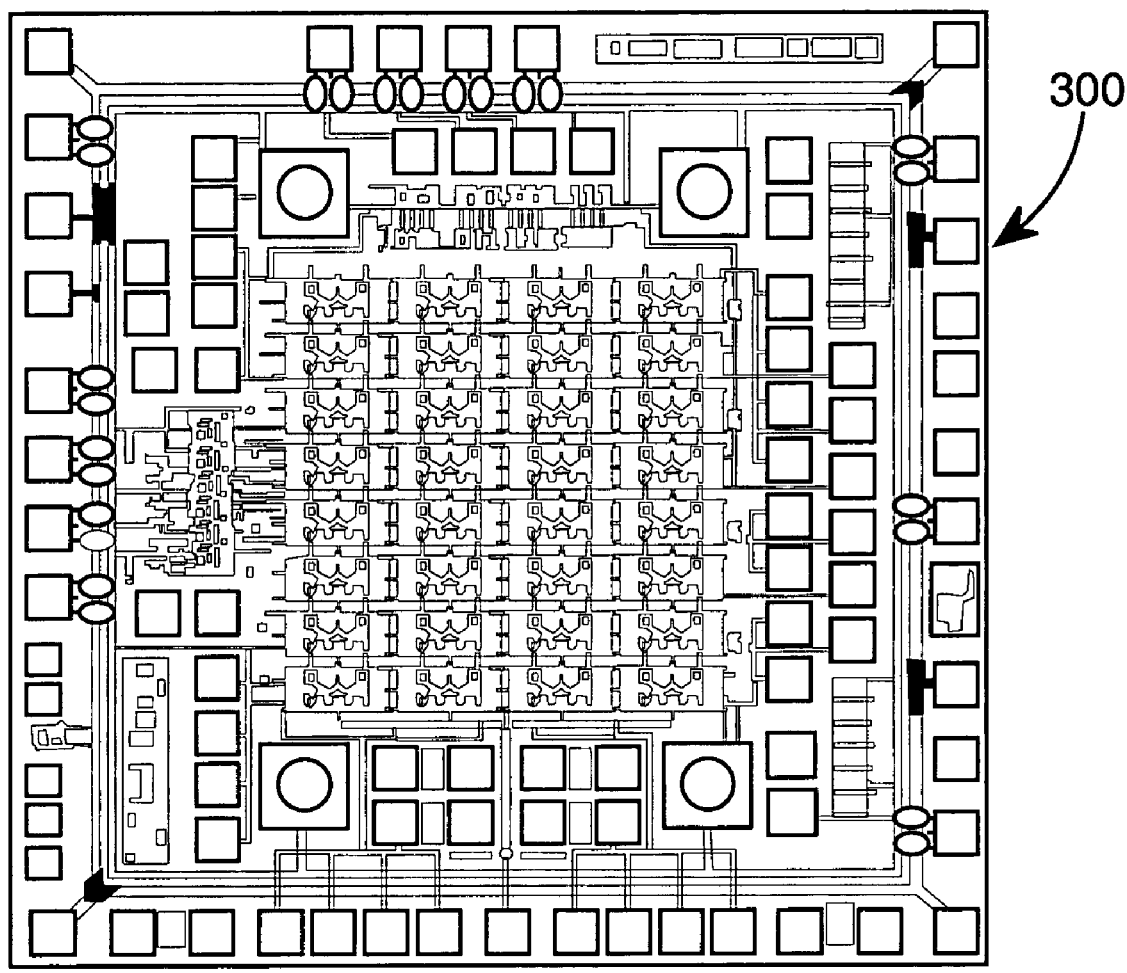
FIG. 3 shows the layout of an electronic circuit module on which the FIG. 2 array may be mounted to form a plurality of micromirror MEMS devices.

The latching off-chip arrangement of the present invention enables the prerelease of for example MEMS modules into a state that is accessible and convenient for ensuing processing such as bonding with for example an electronic circuit module to form a flip-chip MEMS device. It appears especially desirable that the MEMS module in the present invention is free of its fabrication substrate and yet sufficiently well supported and protected to be of convenient access and manipulation capability during bonding and possibly other steps of the MEMS device fabrication sequence. FIG. 1, FIG. 2, FIG. 3 and FIG. 4 in the drawings illustrate the use of this latching off-chip hinge mechanism in a preliminary overall manner. In FIG. 1, FIG. 2 and FIG. 3 a flip-chip MEMS array is rotated and latched off the edge of a host module, i.e., off a sacrificial substrate used to fabricate the MEMS module portion of the MEMS device. As may be apparent to those skilled in the MEMS art it is also possible to reverse the roles of the MEMS module array and the electronic circuit module array in this FIG. 1, FIG. 2, FIG. 3 and FIG. 4 rotation based sequence with suitable modifications of the arrays. A detailed description of the FIG. 1 and FIG. 2 mechanism and its fabrication, assuming selection of a provided optional MEMS module rotation option, follows the present overall introductory discussion.

The micromirror array 100 shown in FIG. 1 is arranged to include an 8×8 modules array of cantilever micromirror modules intended for marriage with similarly sized and compatibly disposed electronic circuit modules that may also be in array form. The present invention is of course also applicable to individual devices that are not disposed in this array form. In FIG. 1 the micromirror array 100 is attached to a hinge mechanism 102 through tethers 104 that can be severed once the array is rotated and bonded onto for example a CMOS receiving module array as is shown at 300 in FIG. 3. The tethers 104 may be of whatever length is needed in order to allow positioning of a MEMS module over the electronic circuit module i.e., tether 104 length is determined by the size and layout of the electronic circuit module and the need to reach across parts of this module in positioning and aligning the MEMS module.

After release, the array 100 is rotated off the edge of the chip 106 and latched into place by a slider assembly shown generally at 108 in the FIG. 1 drawing. An etch plate or release plate or protective member or shield member or header member 112 (herein primarily referred-to as an etch plate member) is used to connect the tethers 104 to the hinge mechanism 102 and serves the significant additional functions described subsequently herein. The name "etch plate" is recognized as being somewhat generic and non descriptive at first blush for the element 112, however since one of the functions of this element is to supply structural support for a MEMS device during susceptible parts of an etching process this name is believed not altogether inappropriate. The hinge mechanism 102 is anchored to the substrate 110 of the chip 106 by a row of first hinge portions. A row of second hinge portions connects the etch plate or protective member or header members 112 to the row of first hinge portions and the substrate 110 via a hinge pin, all as described in greater detail below herein.

Notably in the FIG. 2 status the array 100 can be metallized with reflective materials without masking or preprocessing. The array 100 is then aligned over the CMOS receiving module 300 of FIG. 3 where bonding, using for example one of a variety of conductive adhesive materials, may be accomplished. It is particularly notable that the procedure represented in FIG. 1, FIG. 2 and FIG. 3 can be completed using only a standard probe station probe element as a manipulating tool. In the identified example the final MEMS devices will consist of surface-micromachined mirror surfaces that are bonded directly above address electrodes located over, in this instance, latching CMOS addressing circuits. Each mirror surface may be supported by compliant flexures connected to a bonding frame that surrounds it. This frame also provides uniform resting support throughout the array.

Figure 4:
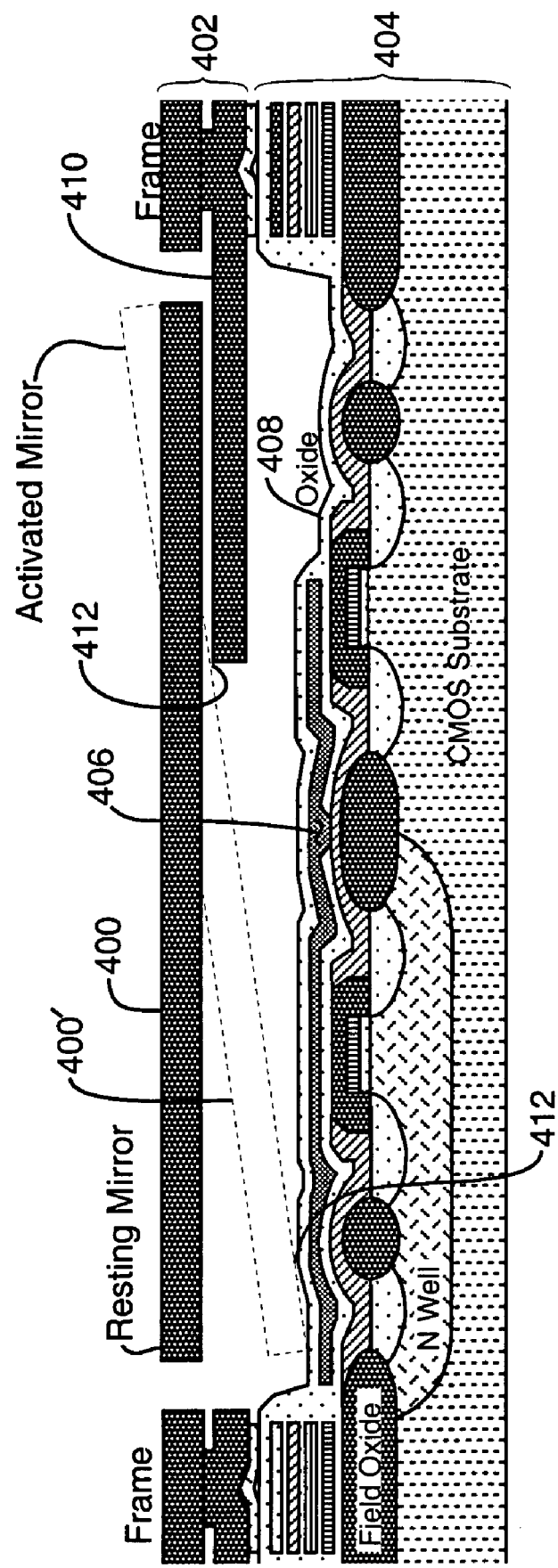
FIG. 4 shows a representative partial cross section view of a representative MEMS device inclusive of modules of the FIG. 2 and FIG. 3 types.

Additionally in order to better appreciate details of the present invention FIG. 4 in the drawings illustrates a single MEMS device achievable with the assistance of the invention in which a mirror surface deflects when a CMOS address cell is activated. In the FIG. 4 cross sectional view an individual cantilever micromirror 400 and 400' (in its two operational positions) of a MEMS module 402 is disposed positions enabling its control by the electrical circuits of a CMOS module 404. In the FIG. 4 illustration, the address electrode 406 of the CMOS module 404 is shown wired to the drain of some arbitrary complementary logic circuit transistor to effect this control. The electrode 406 is formed in the upper metal layer of a CMOS process and remains covered with a thin layer of oxide 408 for protection and isolation from the mirror surface. Each feature within a FIG. 4 type of device is carefully arranged with specific topographical considerations such that mating elements align properly when positioned into the FIG. 4 condition and no object interferes with the motion of any other.

In FIG. 4 the mirror 400 lower surface will actually come to rest on an area of field oxide at 412. Without the spacer layers shown under each column of the bonding frame, at 410 for example, some of the mirror 400 surfaces in an array would achieve no more than a 2 degree range of tilt. The spacer layers 410 added to the MEMS module however elevate the mirror 400 enough for many devices to achieve roughly 5 degrees of tilt. The pivot point for the mirror 400 is located on the spacer layers 410 portion of the MEMS module 402 and appears at 412 in FIG. 4. The FIG. 4 drawing illustrates the final disposition of the modules 402 and 404 in a MEMS device preferably following use of the present invention in achieving this disposition. The present invention is of course not limited to micromirror devices as shown in FIG. 4 but can relate to most MEMS device types.

FIG. 5 in the drawings includes the vertically aligned views of FIG. 5a, FIG. 5b and FIG. 5c and shows details previously recited and additional details relevant to the present invention. Identification numbers appearing in the FIG. 5 drawings and the other drawings herein repeat those used in FIG. 1 through FIG. 4 to the best degree possible; in other words element identification numbers remain consistent in the drawings of the present document once assigned, to the best degree possible. New identification numbers including the drawing FIG. number in the hundreds digit position are assigned in FIG. 5 and the ensuing drawings as are needed in the related discussion.

The array 100 and the FIG. 5 mechanism may be fabricated from a variety of materials including semiconductor materials. Notably the materials used in the array 100 and the FIG. 5 mechanism may be either similar to or totally different from and incompatible-with the materials used in the electronic circuit module 300 or 404 with which the array 100 and the FIG. 5 mechanism are to be married in a completed MEMS device. This is of course one of the major advantages of a MEMS device. One family of materials that are convenient for realization of at least experimental or prototype MEMS modules is based on the Multi-User MEMS Process (MUMPS) that is available from Cronos Incorporated, www.memsrus.com. Cronos Incorporated was acquired by MEMSCAP in November, 2002, see http://www.memscap.com/. The MUMPS process is especially relevant to MEMS device fabrication in a so-called semiconductor foundry setting where a significant volume of and variety of semiconductor devices of individual customer origin are fabricated on a commercial basis. Fundamentally the MUMPS process involves the use of Silicon semiconductor materials and provides two releasable, user-configured, layers of poly-crystalline doped and electrically conductive silicon structural material, herein these layers are identified as "Poly-1" and "Poly-2". These layers are first and second deposited layers over a substrate or substrate-carried structures, layers that are segregated by an intervening layer of easily etched and removed oxide material such as silicon dioxide. A substrate attached "Poly-0" layer is also present in the MUMPS process however this layer is not used in the flip process described herein. Use of the MUMPS process and these materials is presumed in following portions of this document. The trapped MUMPS process oxide layer is preferably of 0.5 micrometer thickness in the present invention. Notwithstanding this MUMPS process presumption, it is of course realized that MEMS devices can be fabricated from a large variety of materials including, for example Gallium Arsenide, Germanium and other semiconductor materials, and therefore applicant desires not to be limited by this disclosure in terms of the MUMPS and Silicon materials process.

The MUMPS process and its two oxide-separated polysilicon layers is in reality a desirably simple and inexpensive process in comparison with for example the SUMIT process which provides up to four releasable layers of semiconductor material. The SUMIT process is known by the more complete name of Sandia Ultraplanar Multi-level MEMS Technology and is available from Sandia National Laboratories at Kirtland Air Force Base in Albuquerque, N. Mex., http://mems.Sandia.gov/scripts/index.asp. Either the SUMIT or the MUMPS process or another process of these natures as is known in the art may be used with the present invention. It is especially notable that even a relatively simple and two layer process such as MUMPS may be enhanced significantly by way of the present invention since the invention easily supports an arrangement wherein multiple MEMS modules are fabricated on the same or on different substrates and are then stacked on top of each other during the bonding process of a MEMS device. In this manner the present invention enables the fabrication of a complex MEMS device of 2, 4, 6, 8 or more layers or even any number, N, layers while using merely a simple and inexpensive, even two layered, fabrication process. The complexity of the fabricated MEMS device can be enhanced significantly by this access to a greater number of releasable layers during fabrication.

In FIG. 5a the etch plate 112, and its associated collection of hinge portions 500, 502 and 504 etc. of hinge 512, rigidly support the tethers 104. In the arrangement of the present invention these tethers 104 connect with a flip-chip device to be rotated off the edge 506 of the host chip or sacrificial substrate 110 on which the FIG. 5a MEMS module is fabricated. Although hinges for use in MEMS and other surface micromachined devices are believed known in the art, a brief discussion of the FIG. 5 hinge 512 is believed appropriate herein. Thus, each of the hinge portions 500, 502 and 504 appearing in the FIG. 5 drawings represents a clevis element of an actual pin and clevis hinge of the type shown in greater detail in the FIG. 7 drawing herein. In FIG. 5 these clevis element are represented to be attached to the etch plate 112 while the pin elements of each these hinge portions are attached to or integral with the substrate 110.

Figure 7:
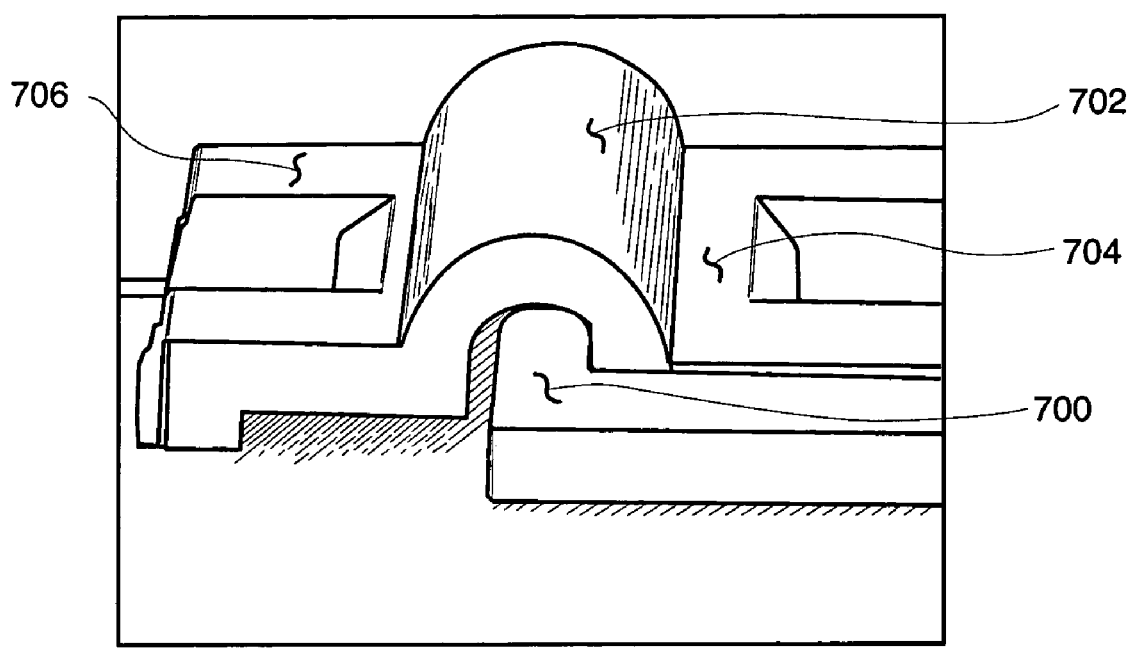
FIG. 7 shows details of a typical hinge mechanism usable with the present invention.

In the FIG. 7 drawing the clevis element of a hinge appears at 702 and a contoured form of a pin element appears at 700. The wings 704 and 706 in the FIG. 7 hinge attach the clevis element to a substrate member while the pin element 700 attaches to a hinge-anchored rotating element. Thus the FIG. 7 hinge is a reverse arrangement of the hinge portions appearing in the FIG. 5 drawing. A hinge of similar arrangement to that of the FIG. 5 and FIG. 7 hinge is additionally disclosed in the U.S. Pat. No. 5,994,159 of V. A. Aksyuk et al. and also in the U.S. Pat. No. 6,300,156 of H. L. Decker et al.; patents that are hereby incorporated by reference herein. Notably the Aksyuk et al. and the Decker et al. patents involve the erection of pseudo three-dimensional structures on the surface of a MEMS device rather than the rotated, sacrificial substrate-free, processing of a MEMS module.

In actually each of the hinge elements appearing in the FIG. 5 and the FIG. 7 drawings is comprised of polysilicon in a MUMPS process device. According to this arrangement each of the clevis and wings 702, 704, 706 are portions fashioned by etching from a single upper layer of polysilicon, i.e., a Poly-2 layer while the pin element 700 is part of a lowermost and first deposited lower Poly-1 layer of polysilicon. These two layers of polysilicon are originally separated by an etch-responsive layer of oxide material that initially fills the interior of the clevis 702 between polysilicon layers until it is removed in a controlled etching sequence to free the pin 700 into the illustrated rotatable condition. During fabrication of the polysilicon layers once the polysilicon 1 hinge pin 700 is formed the oxide layer and the overlying polysilicon 2 layer conform to its shape and thus form the shape of the clevis 702. Notably the uppermost or Poly-2 of the two polysilicon layers is not required to completely surround the pin element 700 in order to achieve the FIG. 7 hinge; the lower portion of the clevis 702 is in reality supplied by the substrate of the device. The two polysilicon layers of the MUMPS process are in actually also sufficient to form each of the other MEMS module elements shown in the FIG. 5 drawing as is noted in appropriate locations of the following paragraphs of description.

The etch plate 112 is fabricated with initial tether connections to the anchor member 516 shown in FIG. 5a and FIG. 5c. According to this arrangement the etch plate remains captured in its connection with the substrate 110 notwithstanding removal of the oxide layer (or layers) that originally hold it captive, i.e., oxide layers removed during the course of normal fabrication of the MEMS module. As this statement implies, the present invention can be fabricated in structural layers of a device that are elsewhere needed; the addition of layers for present invention purposes is thus not necessary.

Tethered release of the etch plate into a rotatable condition in the FIG. 5 apparatus is therefore a fully controllable event that may be initiated at a convenient point in the fabrication process following the oxide etching event, a point in fact preferably selected to be late in the processing and after release of the array 100. Remainder portions of the tether elements used to accomplish this retention and release of etch plate 112 from substrate anchor element 516 appear at both 518 and 520 in the FIG. 5c drawing. These remaining portions are joined in the FIG. 5a pre-rotation condition of the MEMS device and are severed by a burn-through electrical current or physical rupture or by laser burning in the manner of the tethers 104 as described elsewhere herein. In the FIG. 5a pre release condition the joined tethers at 518 and 520 oppose the uplifting force of the lifting beams 508 and 510. Notably processing of the FIG. 5 modules can be accomplished by way of conventional non-rotating flip-chip processing techniques by omitting the severing of tethers 518 and 520 and thus maintaining the MEMS module in the FIG. 5a condition if desired. Cross sectional details of the substrate anchor element connecting with tethers 104 are shown in the FIG. 6a drawing.

The cooperating action of the tethers 518, 520 and anchor 516 in holding the etch plate 112 in its substrate adjacent FIG. 5a condition until intentionally terminated by a burn or laser releasing event thus allows the FIG. 5 apparatus to electively be used in either the hinge-rotated or the conventional non-hinge-rotated bonding modes. If the tethers 518, 520 are maintained in integral condition the FIG. 5 MEMS module may be bonded in the conventional substrate present flip-chip manner since the combination of hinge 512 and anchored tethers immobilize the MEMS module 100 with respect to the substrate. If however these tethers are segregated and hinge rotation of the etch plate and MEMS module are thusly allowed to occur, then the presently discussed off chip bonding mode becomes available.

Also appearing in the FIG. 5a and FIG. 5c drawings are a pair of lifting beam members 508 and 510 used in accomplishing an initial separation of the etch plate 112 and the array 100 from the substrate 110 in commencement of the FIG. 5b and FIG. 5c illustrated off chip rotation process after segregation of tethers 104. The lifting beams 508 and 510 may be simply passive bimorph actuators, fabricated from polysilicon and overlying gold for example, that are used to initially elevate the arrays as a result of temperature-induced thermal stresses generated in the lifting beams following environmental temperature change (e.g. change from fabrication temperature to room temperature). This thermal mismatch between the two layers of each beam 508 and 510 results in an upward force at the rightmost end of the beams 508 and 510 once the module elements are released from the substrate by an oxide etching process; the presence of this lifting force therefore precedes segregation of the tethers at 518 and 520.

The free ends of the lifting beams 508 and 510 are placed near the rotational axis of the hinges 512 in order to maximize the lifting effect on the etch plate 112 and so that the flip-chip structures are sufficiently elevated for convenient access. Preferably this lifting is arrange to permit use of probe tip engagement with etch plate 112 in completing the rotation. Separation distances in the range of 10 to 15 micrometers between the hinge axis and the hinge-adjacent ends of the lifting beams 508 and 510 are found to be suitable. Cross sectional details of the free end of the lifting beams 508 and 510 appear in the FIG. 6k drawing. For stability enhancement purposes the etch plate 112 is arranged to be larger than the largest flip-chip structure to be serviced. The etch plate is preferably the last element on the surface of the host module to be released and therefore the only structure to bear the force of the lifting beams 508 and 510. Otherwise, delicate features such as micromirror flexures could rupture before the surface is fully released from the sacrificial substrate. The etch plate 112 is preferably composed of a multi layered structure of polysilicon as is illustrated in the FIG. 6i drawing.

The thin tethers used in locations 518 and 520 in the FIG. 5 modules may be removed by a laser cutter or burned off when an electrical potential is applied between for example the anchor and the small pad adjacent to it. The tethers 104 connecting the etch plate to the flip-chip structure are intended to be removed in the same manner once chip rotation and bonding are complete. A small divot or necked-down region in the end of the tethers can concentrate either the mechanical stress or the electrical current density of a burn-through current at a selected point along the edge of the flip-chip structures. A laser cutter is also quite effective for tether disconnection and is in fact the preferred method of removing all forms of tethers from the FIG. 5 mechanism. The anchor tethers 518, 520 are cut to facilitate off-chip hinge bonding while the flip-chip tethers at 104 are severed to permit use of a flip-chip bonding machine and thermocompression bonding in assembling the modules into an integral flip-chip device.

The etch plate 112 is in fact a MEMS module protecting element of some perhaps surprising significance in the overall scheme of the present invention. It is in fact the stabilizing and rigidizing effect of this etch plate member on the flip-chip MEMS module 100 that enables successful manipulation and handling of the module in the espoused removed-substrate state. Without the presence of this etch plate 112 the substrate-removed module 100 would in fact be so fragile and damage susceptible as to be of little or no practical value. Such a substrate-removed module would be vulnerable to distortion and breakage in air currents or washing baths and during manual manipulation for bonding attempts, especially since it is not only thin and fragile in its own right but receives only limited support and contour control by way of elongated severable tethers of for example polysilicon material.

According to the present invention the flip-chip MEMS module 100 is in fact effectively no longer rotatable in the FIG. 5c drawing view but is rigidly held in position with respect to substrate 110 by the combined effect of the hinge 512 and the latching slider assembly 105 and its engagement with the etch plate 112 in FIG. 5c. This engagement involves the etch plate tongue element 514 as is discussed in subsequent paragraphs below. By way of clarifying summarization therefore, in the FIG. 5c view of the MEMS module the etch plate 112 has been rotated through an angle of substantially one hundred eighty degrees from the FIG. 5a fabrication position, rotated into a tether supported off chip posture, by way of the hinge 512. The etch plate and thus the MEMS module are held rigidly in this position by the freedom of rotation-only characteristic of the hinge 512 together with the rotation-precluding nature of the latching slider assembly 105.

The latching slider assembly 105 is shown in plan view detail in the FIG. 5b and FIG. 5c drawings. Cross sectional views taken along the slider assembly 105 and through adjacent portions of the FIG. 5 assembly, views taken along the eleven cutting lines a—a through k—k in FIG. 5c, appear in the eleven views of the FIG. 6 drawing herein and are described in ensuing paragraphs herein. As may be observed with respect to the differences between the slider assembly 105 as it appears in the FIG. 5b and FIG. 5c drawings the leftmost triangular shaped portion 524 of the slider assembly 105 in FIG. 5b becomes segregated into two portions in the FIG. 5c drawing—as a part of the cap portion 522 of the slider assembly being mating with the tongue portion 514 of the etch plate element 112. This mating may in fact be preferably accomplished by way of a probe tip, 528 in FIG. 5c, engaging the aperture 530 in the slider pentagonal portion 524 with a rightward directed force to close the slider assembly gap at 536, in FIG. 5b.

The FIG. 5b gap 536 preferably is made of a shorter length than the tongue 514 in order to prevent damage to the tongue 514 and the etch plate 112 from inadvertent excessive rightward movement from the probe tip 528 engagement. According to this arrangement the two slider portions meet at 540 in FIG. 5b before damage to the tongue 514 can occur. Lengths of 45 micrometers and 50 micrometers for the gap 536 and the tongue 514 are found to be satisfactory for this damage limiting purpose. The remainder parts 532 and 534 of the pentagonal shaped slider portion 524 are actually substrate-attached guide rails serving both to hold the slider assembly in a captive substrate-parallel condition and to prevent inadvertent movement of the slider assembly 105 in the leftward direction by the probe tip 528. The cross sectional shape of the remainder parts 532 and 534 are shown in the drawing of FIG. 6b where the sliding but capturing nature of the remainder parts 532 and 534 also appears. The FIG. 5b and FIG. 5c thin rectangular patterns at 538 in the slider assembly represent dimples resulting from formation of elongated sliding feet 537 as are more visible in the FIG. 6d drawing. The space immediately below the feet 537 in FIG. 6d is of about one-half micrometer thickness and is preserved during the deposition process by the presence of a later removed oxide layer.

The latching slider assembly 105 in FIG. 5 is thus topographically disposed using a vertical spacer plate to elevate the tongue and cap during fabrication. Once rotated, the tongue portion 514 of the etch plate 112 rests beneath the cap 522 of the slider assembly 105 so that the tongue and cap mate when the slider assembly 105 is in the engaged-with-etch-plate position. The tongue portion 514 is formed in the upper or Poly-2 polysilicon layer of the FIG. 5 device; when rotated into the FIG. 5b and FIG. 5c positions this upper layer tongue thus is disposed in the lower layer of the rotated etch plate 112 where it is engaged by the slider assembly cap 522. The slider assembly is arranged with left end and right end stops in FIG. 5 to retard excessive, perhaps manually achieved, motion that may damage the rotated etch plate.

After performing a release etch, the etch plate 112 may be rotated and latched into position using the standard micromanipulator of a probe station or even by a hand-held probe tip, as represented at 528 in FIG. 5c, with some practice. When thusly rotated the flip-chip structures formed in the MEMS modules (402 in FIG. 4) are then ready for bonding to for example CMOS receiving modules (404 in FIG. 4) using solder, indium or a variety of conductive adhesives. FIG. 5c shows the slider assembly and etch plate in the latched position and illustrates an additional pad 542 connecting with the tongue 514 that may be used to receive probe tip force and thus accomplish a leveling of the rotated etch plate 112 before the slider assembly can be engaged with the tongue in some instances.

With the FIG. 5 anchor tethers cut, the lifting beams 508 and 510 provide sufficient elevation such that arrays may be easily rotated off the edge of the module in the presence of methanol fluid resistance during a release rinse. Care is however needed when removing the substrate free MEMS module structure from a rinse bath to avoid surface tension damage to delicate elements. After removal from the rinse the arrays can then simply be dried in air rather than using a critical point dryer since they no longer rest above a substrate that would ordinarily damage mirror surfaces or other structure as methanol or another rinse agent evaporates. The lifting beams 508 and 510 appear in cross sectional representation in the FIG. 6a drawing where a metallic gold layer is shown at 600, 602 and 604 and this gold is shown to overlay a Poly-1 layer.

FIG. 6 in the drawings therefore includes the eleven views of FIG. 6a, FIG. 6b, FIG. 6c, FIG. 6d, FIG. 6e, FIG. 6f, FIG. 6g, FIG. 6h, FIG. 6i, FIG. 6j and FIG. 6k. Each of these FIG. 6 drawings is a cross sectional representation of a part of the FIG. 5c MEMS module that is taken along the section lines identified with the same lower case letters in the FIG. 5c drawing. Element identification numbers used in the FIG. 5c drawing and in the other drawings of this document are repeated to the best degree possible in the FIG. 6 drawings and are believed to thus identify the structure shown in the FIG. 6 drawings to a degree needing only brief additional clarifying comments.

Figure 6A:
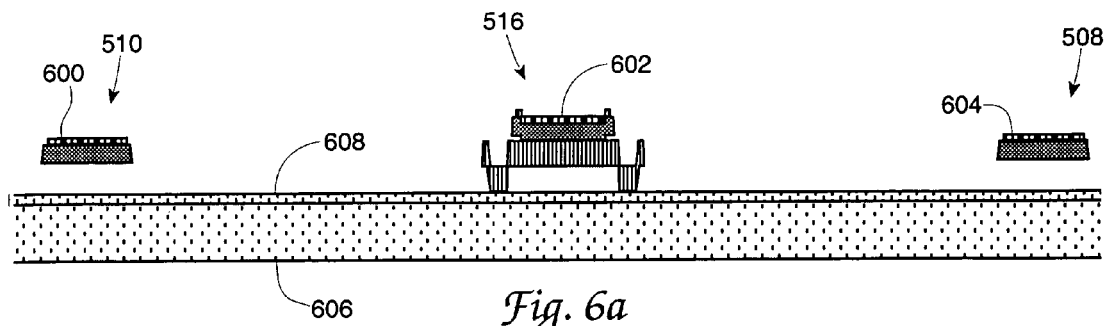
FIG. 6a shows a cross sectional view taken along the section line a—a in FIG. 5c.
Figure 6B:
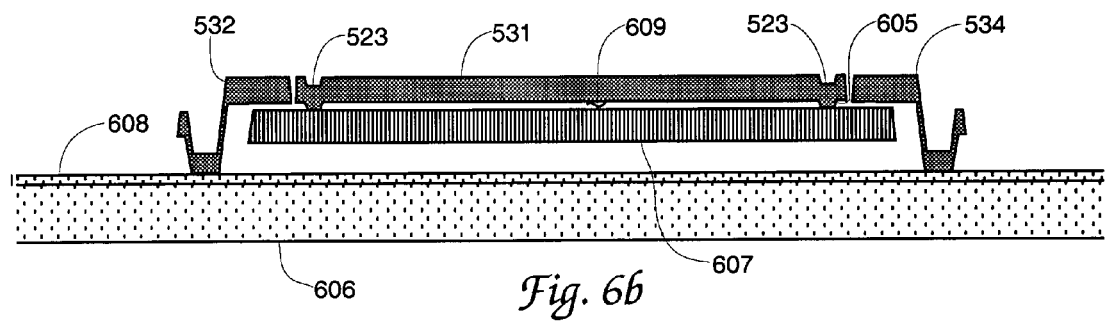
FIG. 6b shows a cross sectional view taken along the section line b—b in FIG. 5c.

By way of such clarification, the FIG. 6a drawing shows the substrate of the FIG. 5 devices at 606; this substrate may be made of doped silicon in the MUMPS process devices. Overlaying the substrate 606 is a nitride electrical insulation layer 608 that may be of ½ to 5 micrometers thickness for example. The upper surface of the nitride layer 608 may be referred-to as the "fabrication surface" of the FIG. 6 device. At 516 in the FIG. 5 and FIG. 6 drawings is represented the anchor used to hold the etch plate 112 in its pre release condition until the tether-severing release is elected. The anchor 516 is composed of rigidly joined Poly-1, Poly-2 and metal layers.

The FIG. 6b drawing represents a cross sectional view taken along the section lines b—b in FIG. 5, i.e., through the head 531 portion of the slider assembly 105. In FIG. 6b the slider head guide rails 532 and 534 may be appreciated to hold the Poly-1 layer 607 of the head 531 captive notwithstanding its movement to the right in the FIG. 5c drawing. The leftwise motion stop portions of the slider head guide rails 532 and 534 may also be appreciated from the FIG. 5c drawing. The nature of the continuous vias 523 and 525 surrounding the periphery of the head 531 and also surrounding the pentagonal opening 530 in the center of the head 531 may also be appreciated from the FIG. 6b drawing. Beneath these vias 523 and 525 lies a permanent joining of the Poly-1 and Poly-2 layers of the slider head at 605 and a trapped oxide space 609 remaining between the Poly-1 and Poly-2 layers as a result of being completely surrounded by the vias 523 and 525 even during an etching step preceding the FIG. 6b view. This trapped oxide transforms the FIG. 6b elements into a three-layer structure of significant rigidity and desirable stiffness. The permanent joining of the Poly-1 and Poly-2 layers of the slider head at 605 in FIG. 6b may of course be achieved by way of forming removed areas in the oxide layer separating the Poly-1 and Poly-2 materials prior to deposition of the Poly-2 layer.

Figure 6C:
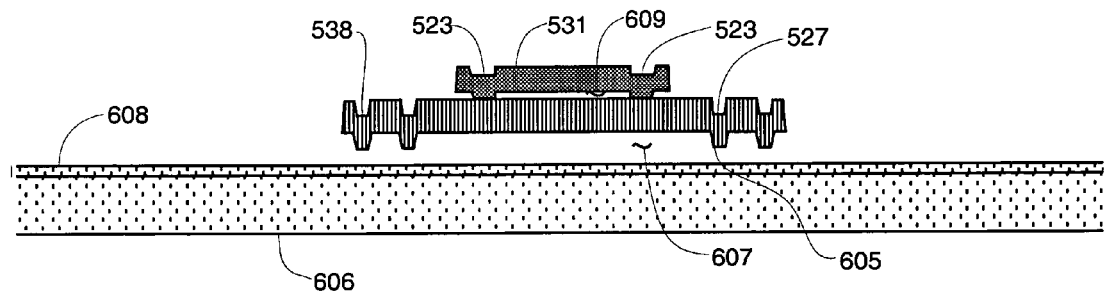
FIG. 6c shows a cross sectional view taken along the section line c—c in FIG. 5c.
Figure 6D:
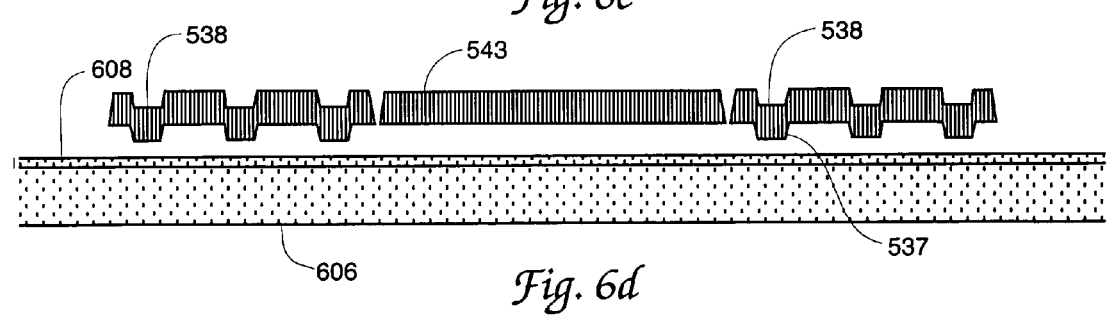
FIG. 6d shows a cross sectional view taken along the section line d—d in FIG. 5c.

The FIG. 6c drawing represents a cross sectional view taken along the section lines c—c in FIG. 5, i.e., through the leading portion of the head 531 and the adjoining portion of the slider assembly 105. The dimples at 527 in both the FIG. 5c and FIG. 6c views of the slider assembly 105 are of interest in the FIG. 6c drawing. These dimples result from a formation of the sliding feet 605. The two-micrometer thick oxide layer formerly present at 607 in FIG. 6c is etched into a recessed pattern of about ½ micrometer thickness below the feet 605 in order to form the feet. Other features of the FIG. 6c drawing are identified in connection with the FIG. 6b drawing. This ½ micrometer thickness provides movement clearance for the slider assembly 105 during the flipped-over MEMS module latching event.

The FIG. 6d drawing represents a cross sectional view taken along the section lines d—d in FIG. 5, i.e., through a single Poly-1 layer portion of the slider assembly 105. The nature of the FIG. 5 recesses 538 overlying the feet at 537 in FIG. 6d is visible in the FIG. 6d drawing. FIG. 6d is a suitable location in the FIG. 6 drawings to also appreciate that the slider assembly 105 in the FIG. 5 drawing is in fact composed of a single elongated strip of the Poly-1 material, material appearing at 543 in the FIG. 6d drawing, and that this single strip of Poly-1 is overlaid at its right most and left most ends in FIG. 5 with segments of Poly-2 material forming the head and sliding cap portions of the FIG. 5 assembly.

Figure 6E:
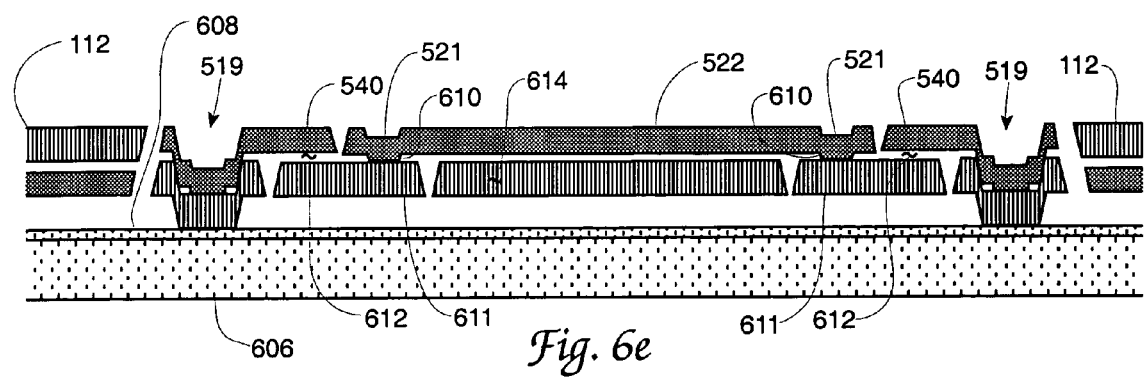
FIG. 6e shows a cross sectional view taken along the section line e—e in FIG. 5c.

The FIG. 6e drawing represents a cross sectional view taken along the section lines e—e in FIG. 5, i.e., through an intermediate portion of the slider assembly 105. Several somewhat unusual details of the FIG. 5 assembly appear in the FIG. 6 drawing; one of these details concerns the manner in which the sliding cap 522 and also the slider assembly 105 are held in captivity adjacent the substrate 606. This captivity is achieved by way of the guide rails at 540 in both FIG. 5 and FIG. 6e holding the Poly-1 layer portions at 611 in confinement below the guide rails. The Poly-1 layer portions at 611 are joined to the cap 522 at 610 in FIG. 6e in the joined polysilicon layers manner discussed with respect to the connection 605 in FIG. 6b and thus the two layer portions at 611 and the cap 522 form a single entity that is confined in sliding fashion by the guide rails 540. Immediately below the cap 522 in the FIG. 6e drawing is a dummy plate member 614 of Poly-1 material used to provide spacing during fabrication of the cap 522 for the tongue 514 that is ultimately held in captivity by the cap 522. The dummy plate member 614 is in a coplanar relationship with tongue 514 when the etch plate 512 is in the latched condition. The square dots 519 in the guide rails 540 in FIG. 5 represent anchor points by which the guide rails 540 and an intermediate layer of Poly-1 material are attached to the nitride layer 608 and the substrate 606 as is shown at the two locations 519 in the FIG. 6e drawing. The similar appearing but smaller square dots at 521 in the FIG. 5b drawing represent connecting vias between Poly-1 and Poly-2 layers as appear at 521 in the FIG. 6e drawing.

Figure 6F:
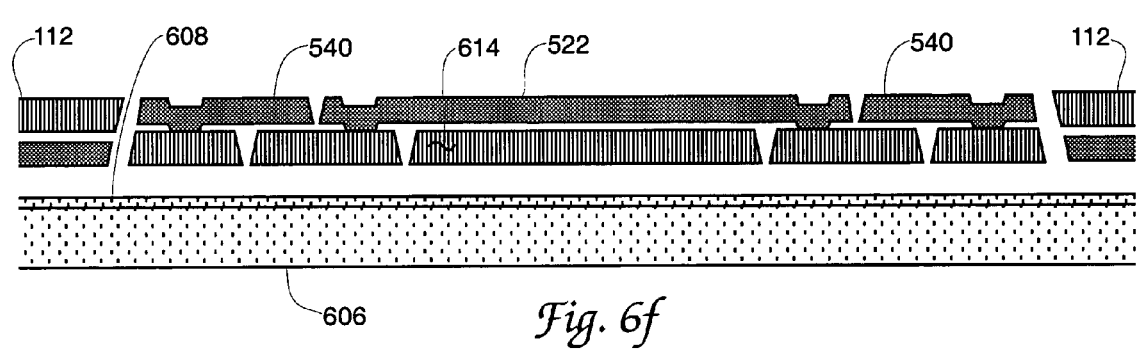
FIG. 6f shows a cross sectional view taken along the section line f—f in FIG. 5c.

The FIG. 6f drawing represents a cross sectional view taken along the section lines f—f in FIG. 5, i.e., through another portion of the slider assembly 105. The only significant difference between the FIG. 6e drawing and the FIG. 6f drawing lies in the absence of showing the guide rail substrate connections at 519 in FIG. 6e in the FIG. 6f drawing.

Figure 6G:
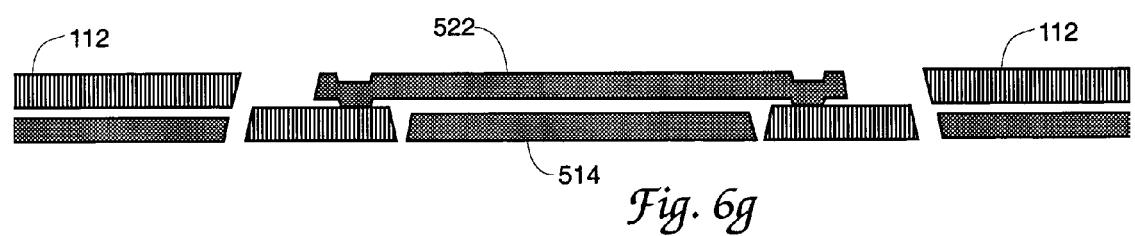
FIG. 6g shows a cross sectional view taken along the section line g—g in FIG. 5c.

The FIG. 6g drawing represents a cross sectional view taken along the section lines g—g in FIG. 5, i.e., through another portion of the slider assembly 105 as it is engaged with the tongue 514. Presence of this engaged tongue 514 rather than the dummy plate 614 represents the major difference in FIG. 6g from that shown in FIG. 6f. Note also the absence of the guide rails 540 in the FIG. 6g drawing; this absence occurs because the FIG. 6g view actually is taken from a flipped location off the substrate 606.

Figure 6H:
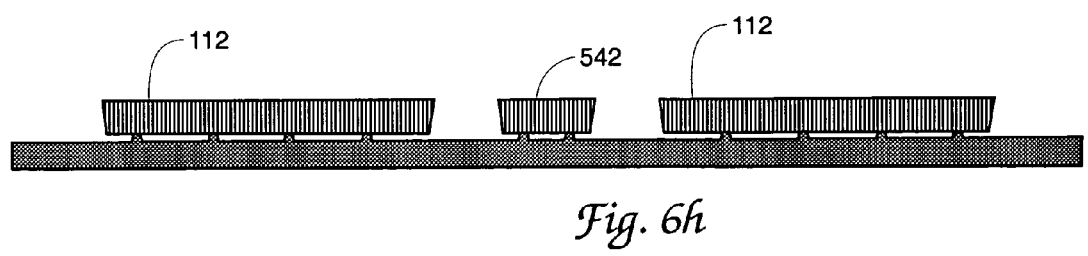
FIG. 6h shows a cross sectional view taken along the section line h—h in FIG. 5c.

The FIG. 6h drawing represents a cross sectional view taken along the section lines h—h in FIG. 5, i.e., through another off substrate portion of the flipped MEMS module assembly. Although little effort is made to maintain scale consistency either within the FIG. 5 and the FIG. 6 drawings or between the FIG. 5 and FIG. 6 drawings, the FIG. 6h drawing is the first in which scale inconsistency becomes immediately apparent. This scale difference is notable with respect to the size of the flipped pad 542 in the FIG. 6h drawing and the layer of Poly-1 material at 543 in the FIG. 6d drawing; these two areas are in fact of the same physical size and are moreover of the same physical size as the void area 503 appearing in the FIG. 5b drawing where the pad 542 was actually formed during the process of fabricating the FIG. 5 MEMS module. As shown in the FIG. 6h drawing the pad 542 is composed of an interconnected combination of Poly-1 and Poly-2 layers. As noted above herein the pad 542 provides a convenient area to which probe tip pressure may be applied in order to flatten parts of the FIG. 5 module especially during engagement of slider cap 522 with tongue 514. The void area 503 is hidden by the slider head 531 in the FIG. 5c drawing. Another void area appears at 544 in the etch plated 112 in the FIG. 5c drawing; this void area is of course the location in which the slider head 531 was fabricated; slider head and void area 544 are coincident in the pre-rotation view of FIG. 5a.

Figure 6I:
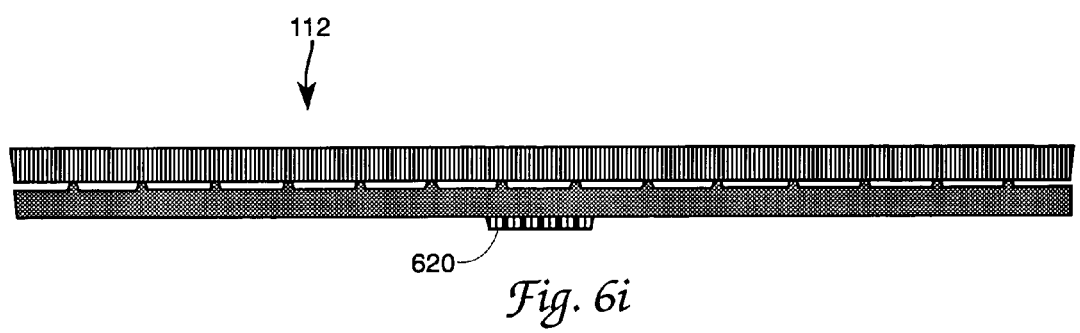
FIG. 6i shows a cross sectional view taken along the section line i—i in FIG. 5c.

The FIG. 6i drawing represents a cross sectional view taken along the section lines i—i in FIG. 5, i.e., through a third off substrate portion of the flipped MEMS module assembly. The notable new feature in the FIG. 6i drawing is the metallic pad 620; this metallic pad also appears in the FIG. 5a drawing where its intended purpose is suggested by proximity to the anchor 516. By way of the pad 620 and the metallic pad portion of the anchor 516, at 602 in the FIG. 6a drawing, it is possible to lower two probes onto the FIG. 5 module and pass an electrical current between these two pads in order to burn through the tethers shown in remainder fashion at 518 and 520 in the FIG. 5 drawing.

Figure 6J:
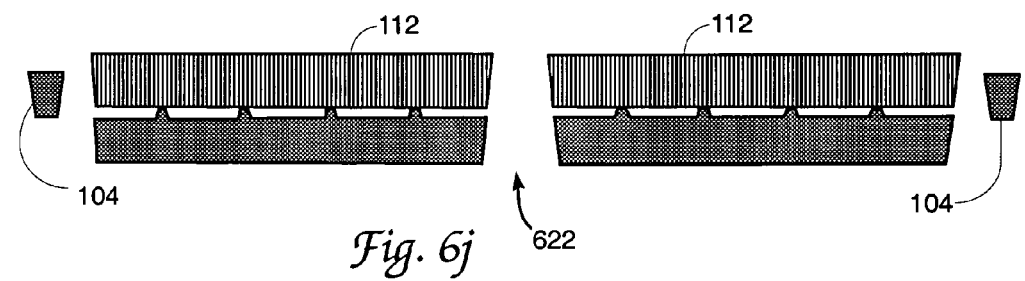
FIG. 6j shows a cross sectional view taken along the section line j—j in FIG. 5c.

The FIG. 6j drawing represents a cross sectional view taken along the section lines j—j in FIG. 5, i.e., through a fourth off substrate portion of the etch plate 112 of the flipped MEMS module assembly. In the FIG. 6j drawing the void nature of the pentagonal pattern surrounding the tether remainder portions at 520 is clearly visible at 622. This pentagonal void arises of course from the slider head 531 having been fabricated in this location in the FIG. 5a view and previous conditions of the MEMS module apparatus. The separated but connected two polysilicon layer composition of the etch plate 112 is also apparent in the FIG. 6j drawing. The often trapezoidal cross section nature of the tethers 104 connecting the etch plate 112 with the MEMS module 100 is also apparent in the extreme left and right portions of the FIG. 6j drawing.

Figure 6K:
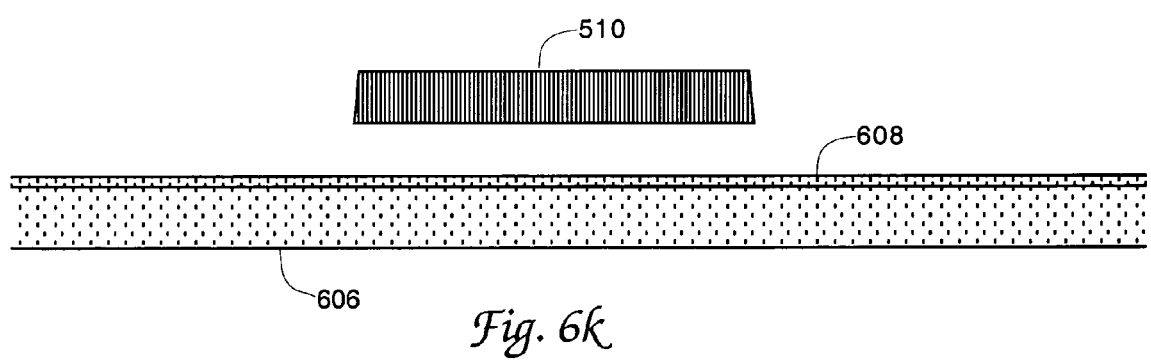
FIG. 6k shows a cross sectional view taken along the section line k—k in FIG. 5c.

The FIG. 6k drawing represents a cross sectional view taken along the section lines k—k in FIG. 5, i.e., through the movable head or etch plate 112 engaging portion of the lifting beam 510 in the flipped MEMS module assembly. By comparing the FIG. 6k drawing with the FIG. 6a drawing it is possible to see that the head portion of the lifting beams is composed of only polysilicon material without the presence of the metallic layer.

FIG. 8 through FIG. 11 in the drawings show another MEMS device use of the latch arrangement described in the FIG. 5 and FIG. 6 drawings. In the FIG. 8 drawing there appears a flexibly connected electrical interconnection bond pad that is a part of a MEMS module for a MEMS device, i.e., a sacrificial substrate micromechanical module as this module appears following removal of the sacrificial substrate. The FIG. 8 bond pad 800 is provided with two tongue elements 802 and 804 that are similar in nature to the tongue element 514 appearing in FIG. 5 herein. The FIG. 8 tongue elements however accomplish a different and permanent function in the MEMS device in that they hold the bond pad 800 in a continuing electrical connection with a corresponding pad 900 of a MEMS receiving module such as the module of FIG. 9 herein.

Figure 8:
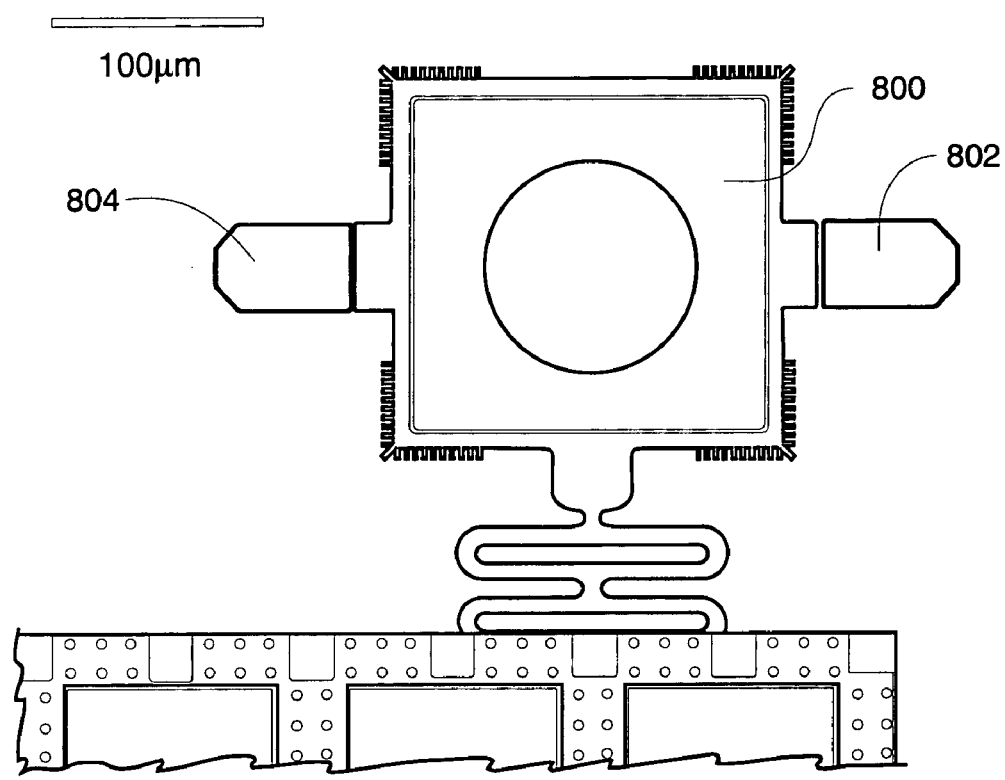
FIG. 8 shows a first part of another use of latch concepts in the present invention.
Figure 9:
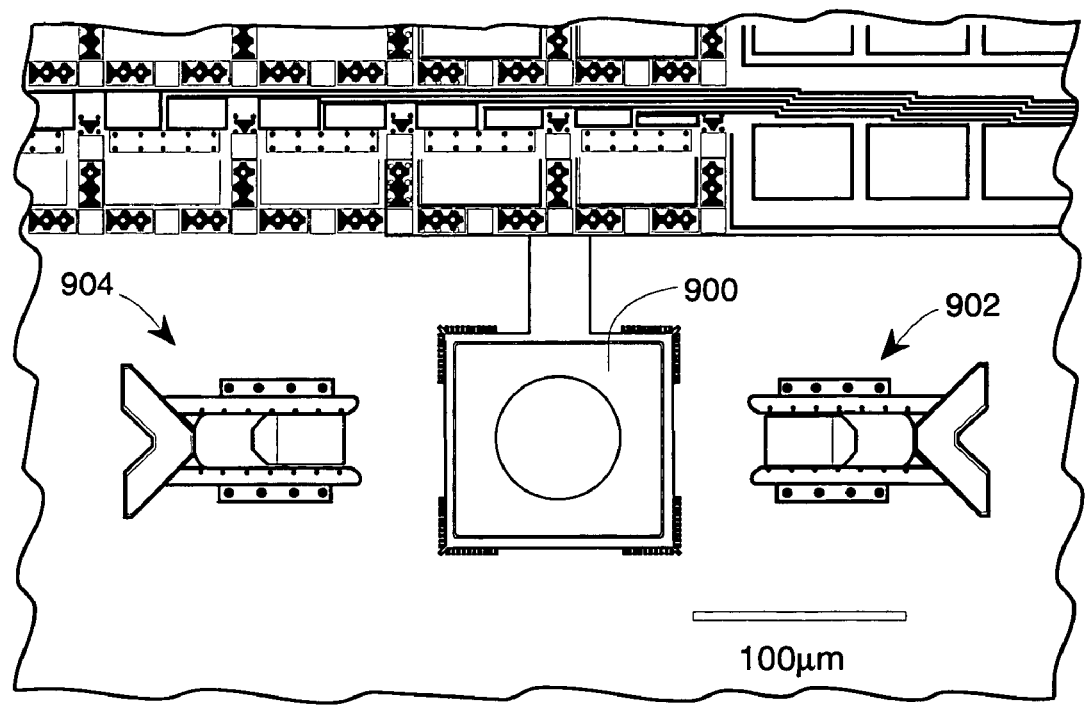
FIG. 9 shows a second part of another use of latch concepts in the present invention.
Figure 10:
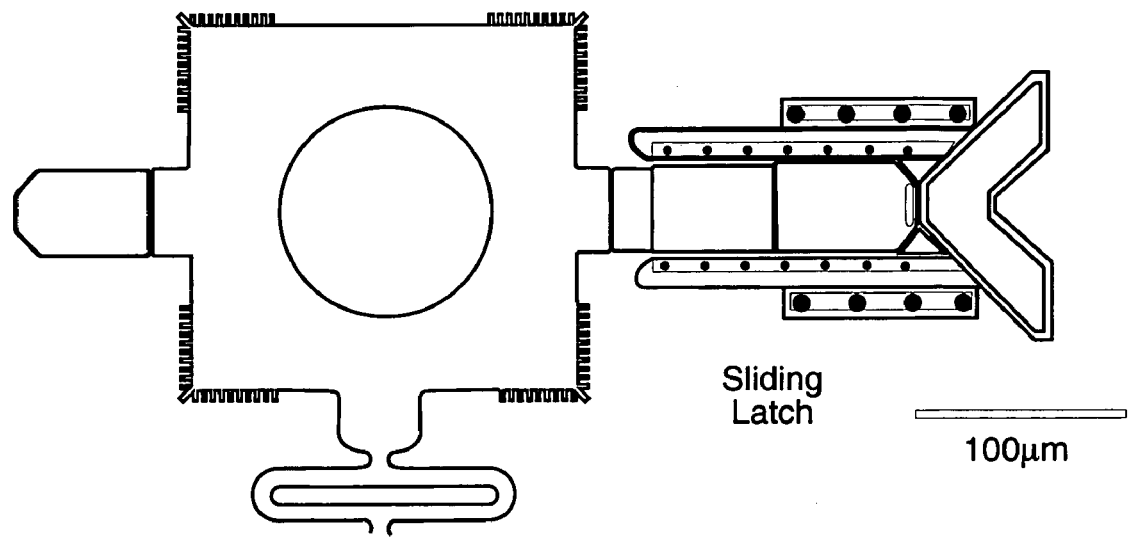
FIG. 10 shows a completed MEMS device view of the FIG. 8 and FIG. 9 latch concepts.

As may be anticipated by the presence of the latch elements 902 and 904 in the FIG. 9 drawing, the FIG. 8 bond pad 800 is intended for latched mating with the FIG. 9 bond pad 900 during assembly of the FIG. 8 and FIG. 9 modules into a MEMS device. This latched mating may also be accomplished with the use of manually manipulated probe tips after alignment of the FIG. 8 and FIG. 9 modules. During the latching part of this sequence one probe tip may be used to hold the aligned modules and pads in pressure fixed position and another probe tip engaged sequentially with each of the sliding caps of latches 902 and 904 to lock the tongues 802 and 804 into a permanent position. In this permanent position the bonding pads 800 and 900 are held in intimate surface contact to complete the desired electrical interconnection between modules. A series of bonding pads of the 800 and 900 types may be dispersed around the periphery of the FIG. 8 and FIG. 9 modules; orientation of the tongues and latches for these pads may of course be altered from that shown in FIG. 8 and FIG. 9 to allow closer spacing of adjacent pad pairs when needed. FIG. 10 in the drawings shows an enlarged view of two bonding pads of the 800 and 900 types in their mated condition with the included sliding latch being in the locked or closed condition.

Figure 11:
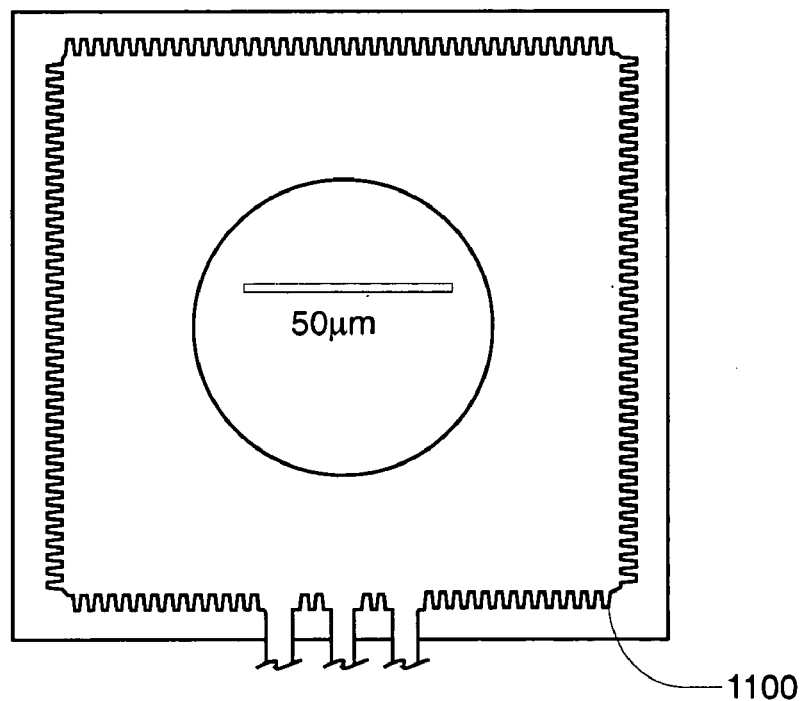
FIG. 11 shows a MEMS module alignment result achieved with the present invention.

FIG. 11 in the drawings shows a view somewhat like that of FIG. 10 of two flip-chip pads in the aligned and bonded condition. The FIG. 11 drawing is included herein for the purpose of illustrating the accuracy achievable during a flip-chip bonding operation using the rotated and latched off chip alignment and bonding of the present invention. In the FIG. 11 drawing, a drawing originating in a microphotograph of an actual bonded MEMS module pair, each of the small tooth-like serrations 1100 surrounding the illustrated bonded flip-chip pads is of two micrometers width and two micrometers length in its physical dimensions. With details of these dimensions being shown in the FIG. 11 drawing it is clear that a misalignment between the superimposed pads of FIG. 9 and FIG. 10 would be clearly visible if it measured so much as one quarter or one half of a micrometer in dimension. As represented in FIG. 11 however achievement of alignments well within this tolerance is achievable with use of the alignment enabled by the present invention.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

I claim:

1. Rotationally mergeable MEMS apparatus comprising the combination of:

an electronic circuit module having a MEMS active element controlling output electrode disposed in an upper layer output location thereof;

a mating MEMS active element module having an electromagnetic field movable active element disposed in an exposed, said output electrode corresponding location thereof, said MEMS active element module including module supporting flexible tensile members connected with a substrate hinge-mounted sacrificial MEMS active element module support element;

a MEMS active element module physical support element latching member movably mounted on said substrate and disposable in a position of mutually locked engagement with said substrate hinge mounted MEMS active element module support element in a selected off-chip and rotated about said hinge location thereof adjacent said electronic circuit module.

2. The rotationally mergeable MEMS apparatus of claim 1 wherein said MEMS active element module physical support element includes a slider element engageable with a tongue portion of said MEMS active element module physical support element in said position of mutually locked engagement.

3. The rotationally mergeable MEMS apparatus of claim 1 wherein said MEMS active element module physical support element latching member is comprised of semiconductor materials included in said MEMS active element module.

4. The rotationally mergeable MEMS apparatus of claim 1 wherein said MEMS active element module physical support element latching member, said module supporting flexible tensile members, said hinge-mounted sacrificial MEMS active element module support element and said MEMS active element module are comprised of silicon semiconductor materials.

* * * * *